(12) United States Patent
Padmanabhan et al.

(10) Patent No.: US 7,230,301 B1
(45) Date of Patent: Jun. 12, 2007

(54) SINGLE-CRYSTAL SILICON SEMICONDUCTOR STRUCTURE

(75) Inventors: Gobi R. Padmanabhan, Sunnyvale, CA (US); Visvamohan Yegnashankaran, Redwood City, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/884,910

(22) Filed: Jul. 6, 2004

(51) Int. Cl.
*H01L 27/01* (2006.01)

(52) U.S. Cl. ....................... 257/353; 438/489

(58) Field of Classification Search ................. 438/39, 438/41, 226, 442, 489; 257/353–354
See application file for complete search history.

(56) References Cited

U.S. PATENT DOCUMENTS 6,323,525 B1 * 11/2001 Noguchi et al. ............ 257/385
2005/0098831 A1 * 5/2005 Lee et al. .................... 257/357

* cited by examiner

*Primary Examiner*—David Vu
(74) *Attorney, Agent, or Firm*—Mark C. Pickering

(57) ABSTRACT

A resistor, a transistor, and a capacitor can be fabricated on a semiconductor wafer in a process that forms an isolated single-crystal region with precise dimensions. The isolated single-crystal region, in turn, defines the body of the resistor, the gate of the transistor, and the top plate of the capacitor.

27 Claims, 7 Drawing Sheets

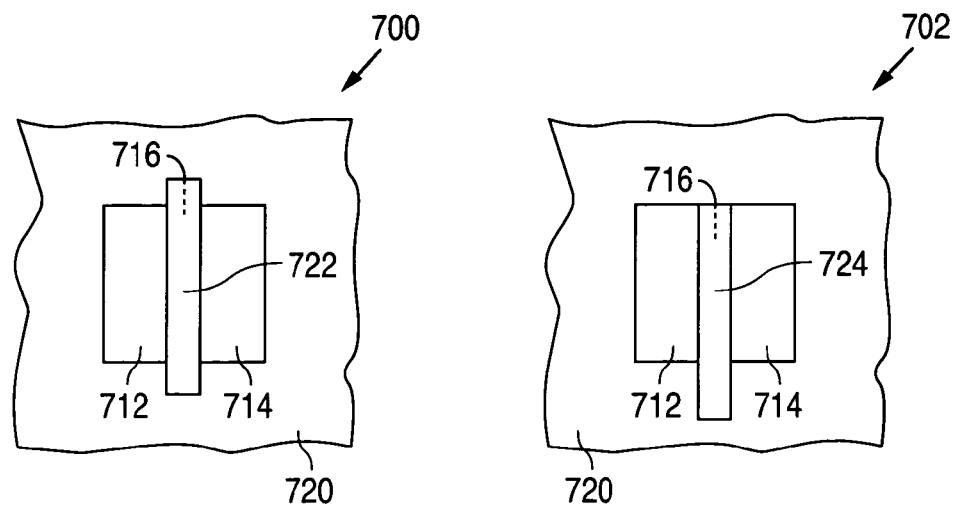
FIG. 7A
(Prior Art)
FIG. 7B
(Prior Art)
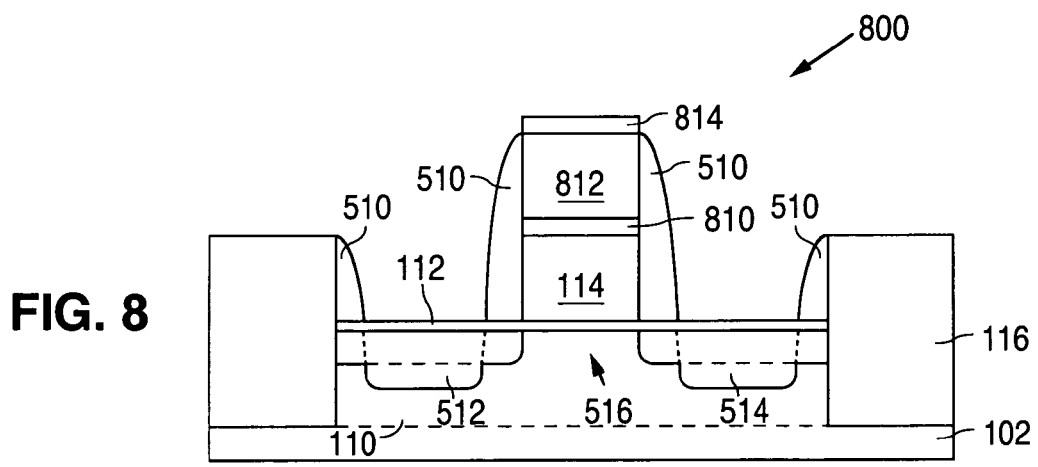
FIG. 8
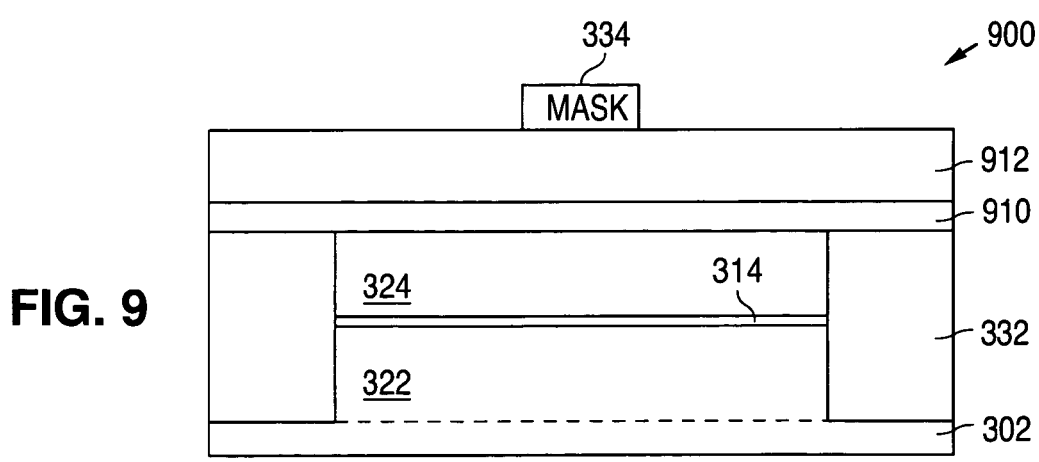
FIG. 9

SINGLE-CRYSTAL SILICON SEMICONDUCTOR STRUCTURE

BACKGROUND OF THE INVENTION

1. Field of the Invention

The present invention relates to semiconductor structures and, more particularly, to a single-crystal silicon semiconductor structure.

2. Description of the Related Art

High precision analog circuits utilize semiconductor structures, such as resistors, which must be matched to a very high degree of accuracy. Current-generation photolithographic processes are extremely accurate, and can be used to form structures, such as polysilicon resistors, which are physically substantially identical to each other.

Although formed to be physically substantially identical to each other (in length, width, and height), polysilicon resistors often have resistances which fall within a wide range of values. This is because the resistance of a polysilicon resistor is strongly dependent on the grain structures within the polysilicon. The grain structures, however, are subject to a number of process variables, such as hydrogen content, which vary widely.

Thus, to have two polysilicon resistors which have equal resistances (values that fall within a very narrow range of values), the polysilicon resistors must be matched by laser trimming procedures which physically remove a portion of one of the polysilicon resistors until the resistive values of the two are equal (fall within the very narrow range of values).

Although the laser trimming process can provide polysilicon resistors which are substantially identical, the process is also time consuming and, thereby, expensive. Thus, there is a need for an approach to forming matched semiconductor resistors which does not require laser trimming.

BRIEF DESCRIPTION OF THE DRAWINGS

FIGS. 7A–7B are views illustrating prior-art transistors.

FIG. 8 is a cross-sectional view illustrating an example of an EPROM 800 in accordance with a third embodiment of the present invention.

FIG. 9 is a cross-sectional view illustrating an example of a method 900 of forming an EPROM in accordance with the present invention.

DETAILED DESCRIPTION OF THE INVENTION

Figure 1A:
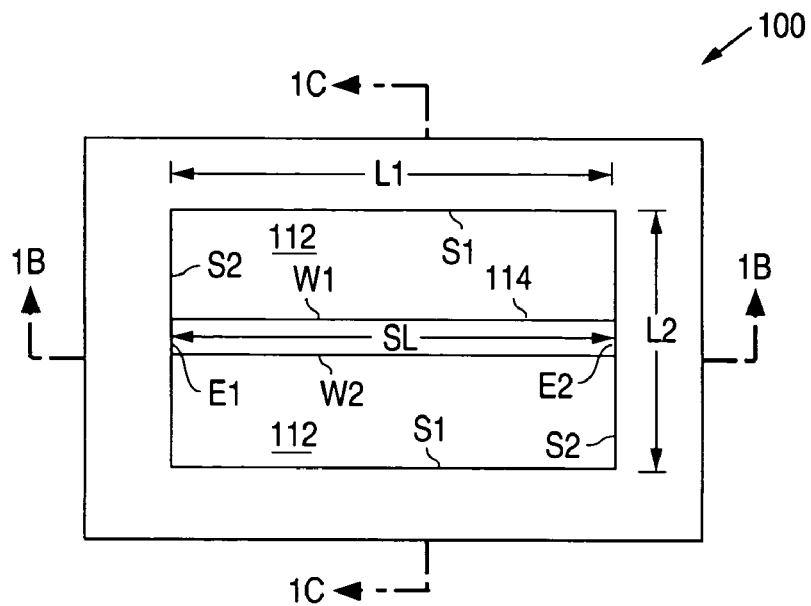
FIGS. 1A–1B are views illustrating an example of a semiconductor structure 100 in accordance with the present invention.
Figure 1B:
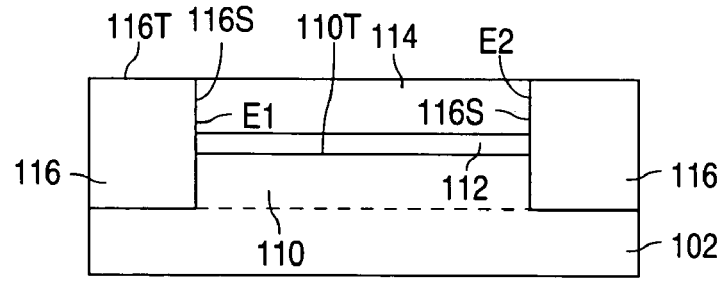

FIGS. 1A–1B show views that illustrate an example of a semiconductor structure 100 in accordance with the present invention. FIG. 1A shows a plan view of structure 100, while FIG. 1B shows a cross-sectional view taken along line 1B—1B of FIG. 1A. As described in greater detail below, semiconductor structure 100 can be utilized to form a number of devices, such as matching resistors, transistors with substantially no edge leakage current, electrically-programmable read-only-memories (EPROMs), radiation-hardened transistors, and capacitors.

As shown in FIGS. 1A–1B, semiconductor structure 100 includes a single-crystal material 102 of a first conductivity type, a single-crystal region 110 of the first conductivity type that contacts material 102, and an insulation layer 112 that contacts and overlies region 110. In addition, semiconductor structure 100 also includes a single-crystal region 114 that contacts insulation layer 112 and overlies region 110. Further, single-crystal region 114 has a length SL, two opposing end walls E1 and E2, and two opposing side walls W1 and W2 that contact the end walls E1 and E2.

Single-crystal material 102 and the single-crystal regions 110 and 114 can be formed from a number of semiconductor materials such as, for example, silicon, germanium, gallium arsenide, aluminum-gallium arsenide, or indium phosphine. In addition, single-crystal material 102 can be lightly doped to have either an n-type or p-type conductivity. Further, single-crystal regions 110 and 114 can be lightly-to-heavily doped to have either an n-type or p-type conductivity. For example, single-crystal region 114 can be implemented as a heavily-doped (n+) region.

Semiconductor structure 100 further includes a trench isolation region 116 that surrounds insulation layer 112 and the single-crystal regions 110 and 114. Insulation layer 112 isolates single-crystal region 114 from single-crystal region 110, while trench isolation region 116 isolates single-crystal region 114 from laterally adjacent regions.

As further shown in FIGS. 1A–1B, trench isolation region 116 laterally defines first single-crystal region 110, and a top surface 110T of first single-crystal region 110. In addition, trench isolation region 116 has a first pair of spaced-apart inner sides S1 that have a first horizontal length L1 and lie parallel to the side walls W1 and W2, and a second pair of spaced-apart inner sides S2 that have a second horizontal length L2 and lie parallel to the end walls E1 and E2. Further, trench isolation region 116 has a top surface 116T and a side wall surface 116S. In addition, the end walls E1 and E2 of single-crystal region 114 contact trench isolation region 116.

In accordance with the present invention, the side walls W1 and W2 of single-crystal region 114 are spaced apart from the first pair of spaced-apart inner sides S1. Further, end walls E1 and E2 of single-crystal region 114 contact only the side wall surface 116S of trench isolation region 116.

Figure 2:
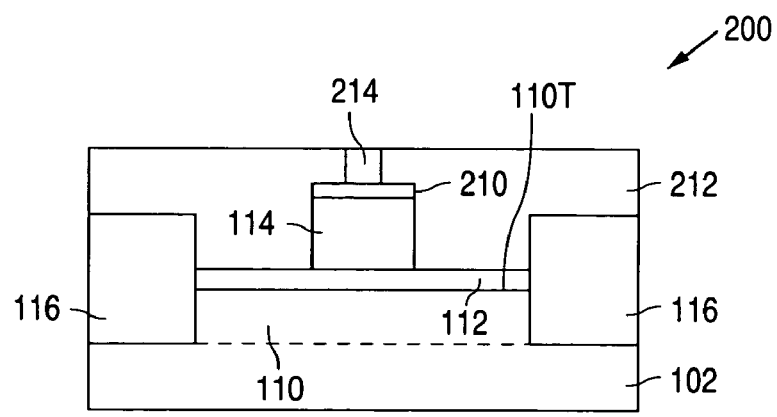
FIG. 2 is a cross-sectional diagram taken along line 1C—1C of FIG. 1A illustrating an example of a resistor in accordance with a first embodiment of the present invention.

FIG. 2 shows a cross-sectional diagram taken along line 1C—1C of FIG. 1A that illustrates an example of a resistor 200 in accordance with a first embodiment of the present invention. Resistor 200 includes semiconductor structure 100 and, as a result, utilizes the same reference numerals as structure 100.

As shown in FIG. 2, when semiconductor structure 100 implements resistor 200, single-crystal region 114 functions as the resistive element, while insulation layer 112 functions as an isolation region. In addition, top surface 110T contacts insulation layer 112 and no region of a second conductivity type.

Resistor 200 additionally includes a layer of metallic material 210, such as a silicide, that contacts the top surface of single-crystal region 114, a layer of isolation material 212 that contacts the top surface of the layer of metallic material 210, and a metal contact 214 that is formed through the layer of isolation material 212 to make an electrical connection with the layer of metallic material 210.

Figure 3A:
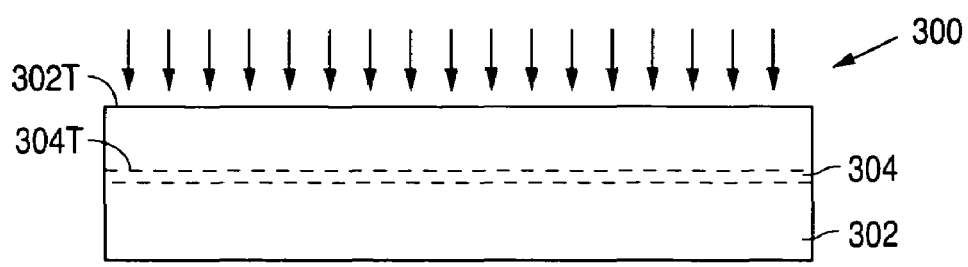
FIGS. 3A–3F are a series of cross-sectional views illustrating an example of a method 300 of forming a number of single-crystal resistors in accordance with the present invention.

FIGS. 3A–3F show a series of cross-sectional views that illustrate an example of a method 300 of forming a number of single-crystal resistors in accordance with the present invention. As shown in FIG. 3A, method 300 of the present invention utilizes a conventionally-prepared wafer 302 which can be formed from a number of single-crystal semiconductor materials such as, for example, silicon, germanium, gallium arsenide, aluminum-gallium arsenide, or indium phosphine. In addition, wafer 302, which has a top surface 302T, can be doped to have either a lightly-doped n-type or p-type conductivity.

As further shown in FIG. 3A, the method begins by forming an isolation mask on the top surface 302T of wafer 302, and then implanting an insulation-forming material, such as oxygen or nitrogen, into wafer 302 at a sufficient energy to form a subsurface implanted region 304 that has a top surface 304T that is roughly parallel with top surface 302T.

Subsurface implanted region 304 can be, for example, 500 Å thick, and top surface 304T can lie, for example, 4000 Å below the top surface 302T of wafer 302. (Subsurface implanted region 304 can have other thicknesses and depths as required to provide the needed isolation.) The isolation mask is then removed.

When oxygen ions (O$^+$) are utilized as the insulation-forming material, the oxygen ions can be implanted with a dose of approximately $2 \times 10^{18}$–$2.5 \times 10^{18}$ ions/cm$^2$ to insure that a continuous insulation layer is subsequently formed. Further, wafer 302 can be optionally heated to more than 400° C. during the implantation of the oxygen ions to insure that the surface maintains its crystallinity during the high-dose implantation.

When nitrogen ions (N$^+$) are utilized as the insulation-forming material, the nitrogen ions can be implanted with a dose of approximately $7.5 \times 10^{17}$–$1.5 \times 10^{18}$ ions/cm$^2$ to insure that a continuous insulation layer is subsequently formed. In addition, wafer 302 can be optionally heated to more than 350° C. during the implantation of the nitrogen ions to insure that the surface maintains its crystallinity during the high-dose implantation. (An amorphous silicon layer is formed on the implant surface when the nitrogen ions are implanted at a temperature less than 350° C. The amorphous silicon layer is recrystallized into polycrystalline silicon during a subsequent anneal step.)

Figure 3B:
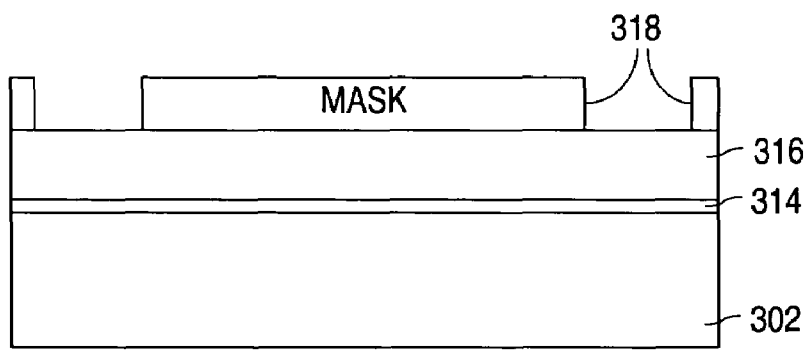

Following this, as shown in FIG. 3B, wafer 302 is annealed in a neutral ambient using, for example, a rapid thermal process (RTP). The RTP process activates the implanted material which, in turn, forms an insulation layer 314 approximately 500 Å thick that has a bottom surface that contacts wafer 302.

Further, insulation layer 314 defines a single-crystal overlying region 316 approximately 4000 Å thick. (Insulation layer 314 and region 316 can have other thicknesses as a function of the thickness and depth of subsurface region 304.) Current-generation implant and annealing processes allow this step to be accurately performed.

Figure 3C:
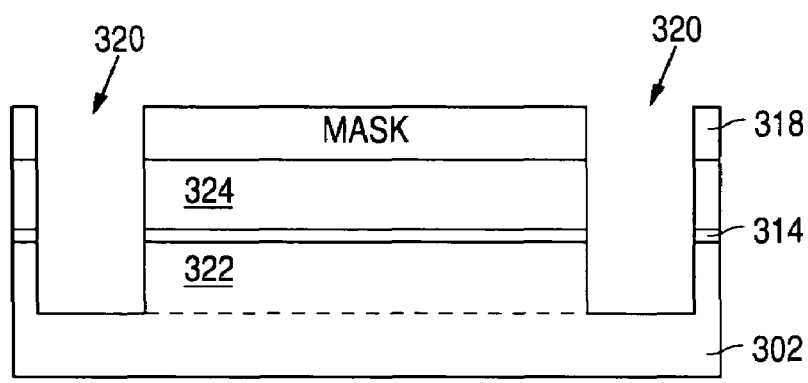

After this, a trench mask 318 is formed and patterned on the top surface of single-crystal region 316. Next, as shown in FIG. 3C, single-crystal silicon region 316, insulation layer 314, and semiconductor material 310 are sequentially etched to form a trench 320 that laterally encircles a portion of overlying region 316.

In addition, trench 320 laterally defines a single-crystal region 322 that lies below and contacts insulation layer 314. Further, insulation layer 314 and trench 320 define a single-crystal region 324 that lies above and contacts insulation layer 314. After trench 320 has been formed, mask 318 is then removed.

Figure 3D:
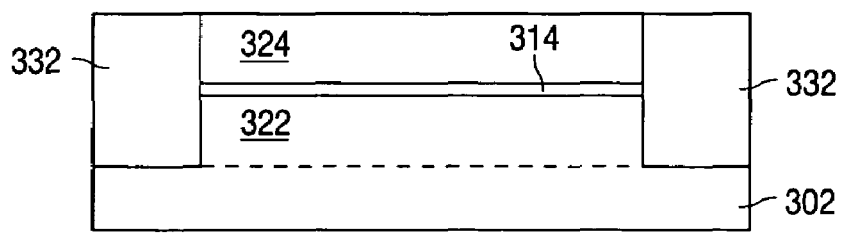

Once mask 318 has been removed, as shown in FIG. 3D, a trench isolation region 332 is formed in trench 320. Trench isolation region 332 can be formed by, for example, depositing a layer of oxide on single-crystal region 324 that fills up trench 320, followed by a planarizing step that exposes single-crystal region 324. Alternately, trench isolation region 332 can be formed by growing a layer of oxide that fills up trench 320 and covers single-crystal region 324, followed by a planarizing step that exposes single-crystal region 324.

Once trench isolation region 332 has been formed, single-crystal region 324 is doped to have a conductivity type and a dopant concentration, such as n+. (Single crystal region 324 can alternately be doped before trench 320 and trench isolation region 332 are formed.)

Figure 3E:
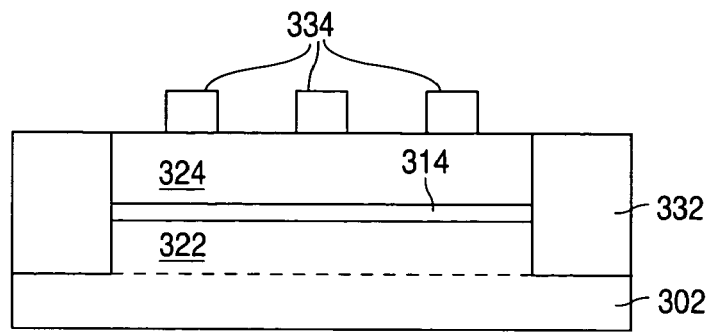
Figure 3F:
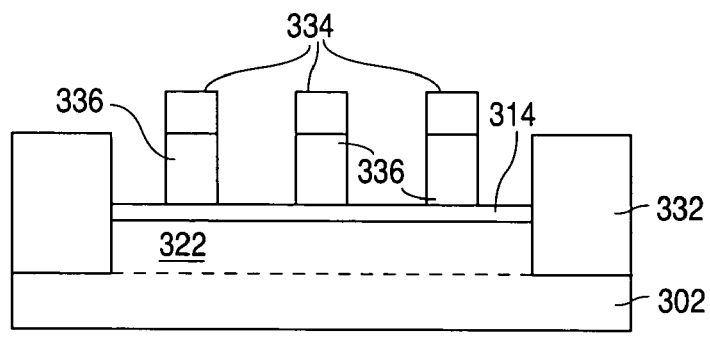

Next, as shown in FIG. 3E, a single-crystal mask 334 is formed on the top surface of single-crystal region 324. Following this, as shown in FIG. 3F, the unmasked regions of single-crystal region 324 are etched until the unmasked regions of single-crystal region 324 have been removed from the surface of insulation layer 314 to form a number of single-crystal strips 336. Mask 334 is then removed, thereby forming resistor 200.

Figure 4A:
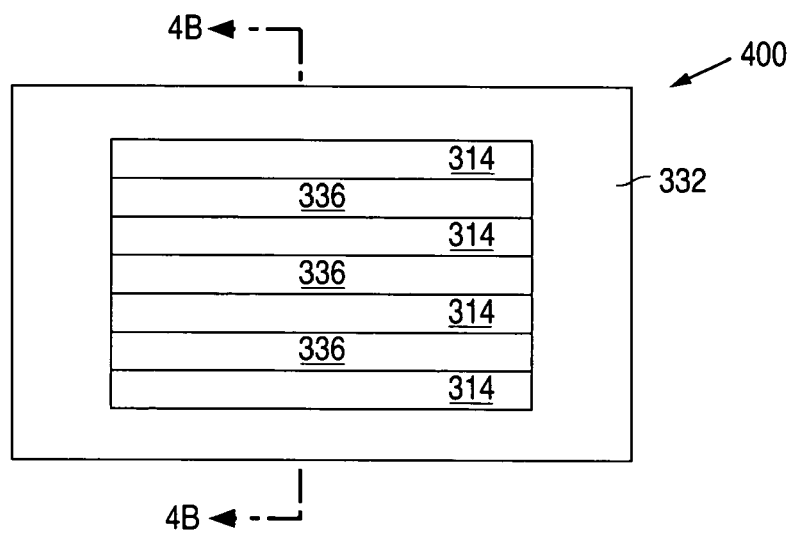
FIGS. 4A–4B are views illustrating an example of the number of single-crystal silicon resistors in accordance with the present invention.
Figure 4B:
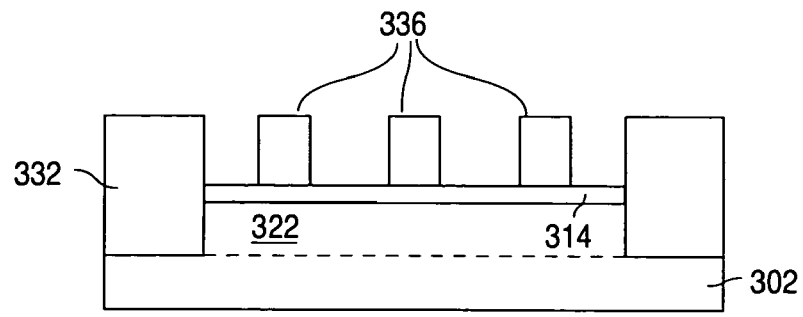

FIGS. 4A–4B show views that illustrate an example of a single-crystal resistor in accordance with the present invention. FIG. 4A shows a plan view of the resistor, while FIG. 4B shows a cross-sectional view taken along line 4B—4B of FIG. 4A. FIGS. 4A–4B illustrate the resistor of method 300 following the removal of mask 334 and, as a result, utilize the same reference numerals used in method 300. (A silicide layer can be subsequently formed on the single-crystal strips, an isolation layer can be formed on the silicide layer, and a metal contact can be formed through the isolation layer to make an electrical connection with the silicide layer using conventional steps.)

As shown in FIGS. 4A–4B, the method of the present invention forms the single-crystal strips 336 to be physically substantially identical (in length, width, and depth). Further, the single-crystal strips 336 are formed to have the same conductivity type and substantially identical dopant concentrations.

However, unlike polysilicon, single-crystal silicon does not suffer from the grain structure issues which significantly affect the resistance of a polysilicon resistor. Thus, in accordance with the present invention, since the single-crystal strips 336 are physically substantially identical, the single-crystal strips 336 have equal resistances (values which fall within a very narrow range of values).

As a result, the present invention provides an approach to forming semiconductor resistors with equal resistances (values that fall within a very narrow range of values) that does not require a laser trimming step. The elimination of the laser trimming step, in turn, is a significant time and cost savings.

Figure 5:
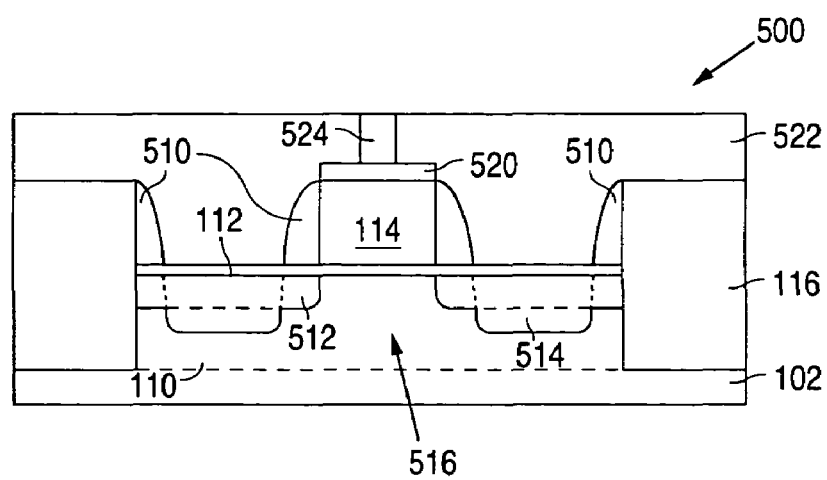
FIG. 5 is a cross-sectional diagram taken along line 1C—1C of FIG. 1A illustrating an example of a transistor 500 in accordance with a second embodiment of the present invention.

FIG. 5 shows a cross-sectional diagram taken along line 1C—1C of FIG. 1A that illustrates an example of a transistor 500 in accordance with a second embodiment of the present invention. Transistor 500 includes semiconductor structure 100 and, as a result, utilizes the same reference numerals as structure 100.

As shown in FIG. 5, when semiconductor structure 100 implements transistor 500, single-crystal region 114 functions as the gate, while insulation layer 112 functions as the gate oxide layer. As further shown in FIG. 5, in addition to structure 100, transistor 500 also includes side wall spacers 510 that contact the side walls of single-crystal region 114 and trench isolation region 116.

Further, transistor 500 includes spaced-apart source and drain regions 512 and 514 of a second conductivity type that are formed in single-crystal region 110, and a channel region 516 that is located between, and contacts, the source and drain regions 512 and 514. Each source and drain region 512 and 514, in turn, has both heavily-doped (n+) and lightly-doped (n−) regions.

Transistor 500 additionally includes a layer of metallic material 520, such as a silicide, that contacts the top surface of single-crystal region 114, a layer of isolation material 522 that contacts the top surface of the layer of metallic material 520, and a metal contact 524 that is formed through the layer of isolation material 522 to make an electrical connection with the layer of metallic material 520.

Figure 6A:
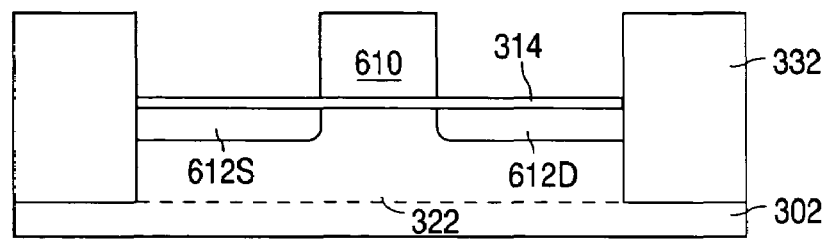
FIGS. 6A–6C show a series of cross-sectional views illustrating an example of a method 600 of forming a single-crystal transistor in accordance with the present invention.
Figure 6B:
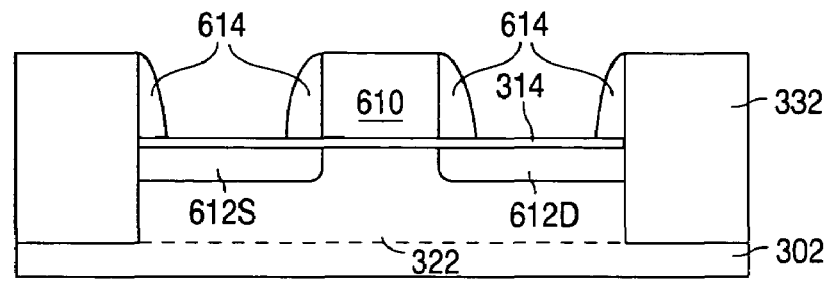
Figure 6C:
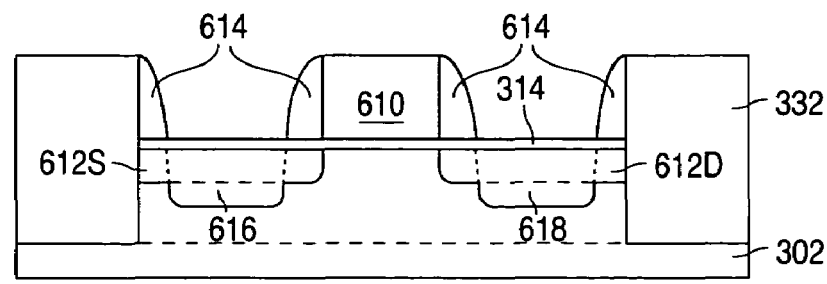

FIGS. 6A–6C show a series of cross-sectional views that illustrate an example of a method 600 of forming a single-crystal transistor in accordance with the present invention. With a few differences, method 600 includes the steps of method 300 shown in FIGS. 3A–3F, and FIG. 6A illustrates the structure that follows the removal of mask 334. As a result, FIGS. 6A–6C utilize the same reference numerals used in method 300 as shown FIGS. 3A–3F.

One difference between method 600 and method 300, up through the removal of mask 324, is that method 600 forms insulation layer 314 to have a thickness of, for example, 65 Å rather than the, for example, 500 Å thickness used with resistor 200 due to the different functions played by insulation layer 314 in the different devices.

Another difference between the example of method 600 and the example of method 300 is that method 600 forms one single-crystal strip rather than the three single-crystal strips 336 shown in FIG. 3F. (Method 600 can alternately use the structure shown in FIG. 3F to form a single-crystal transistor as a multi-fingered device.) In addition, rather than introducing dopant prior to the formation of mask 334, dopant can be introduced into single-crystal region 324 when the source and drain regions are formed.

As shown in FIG. 6A, method 600 continues after the removal of mask 334, which forms a single-crystal strip 610 on insulation layer 314, by implanting the exposed regions of insulation layer 314 to form lightly-doped source and drain regions 612S and 612D, such as n− regions, in single-crystal region 322.

Next, as shown in FIG. 6B, a layer of oxide is formed on insulation layer 314, single-crystal region 324, and trench isolation region 334, and anisotropically etched back to form side wall spacers 614 that contact the side walls of trench isolation region 332 and single-crystal strip 610. Following this, as shown in FIG. 6C, the exposed regions of insulation layer 314 are implanted to form heavily-doped source and drain regions 616 and 618, such as n+ regions, in single-crystal region 322, thereby forming transistor 500. (A multi-fingered device is formed using the same steps.)

The methods for forming a resistor and a transistor can be merged into a single process by using a first masking and implanting step to implant isolation atoms into a number of first subsurface regions that are, for example, approximately 500 Å thick approximately 4000 Å below the top surface, and a second masking and implanting step to implant isolation atoms into a number of second subsurface regions that are, for example, approximately 65 Å thick approximately 4000 Å below the top surface.

One of the advantages of the present invention is that method 600 forms transistors that have substantially no edge leakage current. An edge leakage current, in an NMOS transistor, is a drain-to-source current that occurs when the transistor is turned off. One cause of edge leakage current is misalignment of the gate during fabrication.

FIGS. 7A–7B show views that illustrate prior-art transistors. FIG. 7A shows a plan view that illustrates an NMOS transistor 700, while FIG. 7B shows a plan view that illustrates an NMOS transistor 702. As shown in FIGS. 7A–7B, transistors 700 and 702 both have spaced-apart n+ source and drain regions 712 and 714, a channel region 716 that is located between the source and drain regions 712 and 714, and an isolation region 720 that surrounds the combination of source region 712, drain region 714, and channel region 716.

Transistors 700 and 702 differ in that transistor 700 has a gate 722 that lies over channel region 716 and on an approximately equal amount of the opposite sides of isolation region 720, while transistor 702 has a gate 724 that lies over channel region 716 and on substantially only one side of isolation region 720 such that one end of gate 724 lies at or near the junction between channel region 716 and isolation region 720.

Gate 724 is an example of the problem of gate misalignment, where gate 724 is formed slightly off from where gate 724 was intended to be formed. As a result of gate misalignment, a portion of channel region 716 at the junction between channel region 716 and isolation region 720 can become lightly doped, particularly if angled implants are utilized, providing a charge leakage path between the source and drain regions 712 and 714.

The present invention, however, eliminates the problem of gate misalignment because the position and length of the gate is defined in the self-aligned etch that forms the trench (320). As a result, the length SL of single-crystal region 114 is equal to the first horizontal length L1 (within a very narrow range of values). Thus, the present invention eliminates edge leakage current due to gate misalignment. Further, because there is no overlap onto the trench isolation region, the present invention allows more compact devices to be formed.

FIG. 8 shows a cross-sectional view that illustrates an example of an EPROM 800 in accordance with a third embodiment of the present invention. EPROM 800, which can be implemented as a flash EPROM or a UV-erasable EPROM, is similar to transistor 500 and, as a result, utilizes the same reference numerals as transistor 500.

As shown in FIG. 8, EPROM 800 differs from transistor 500 in that EPROM 800 additionally has a layer of interpoly dielectric 810, such as oxide, nitride, oxide (ONO), that contacts single-crystal region 114, and a polysilicon control gate 812, with an overlying metal (silicide) layer 814, that contacts interpoly dielectric layer 810. (The source and drain regions 512 and 514 can also be covered with the metal (silicide) layer 814.)

FIG. 9 shows a cross-sectional view that illustrates an example of a method 900 of forming an EPROM in accordance with the present invention. With one difference, method 900 is the same as the steps of method 600 shown in FIGS. 3A–3F and 6A–6C. As a result, FIG. 9 utilizes the same reference numerals used in method 600.

As shown in FIG. 9, the one difference between method 900 and method 600 is that, after single-crystal region 324 has been doped, method 900 forms a layer of ONO 910 on the surfaces of single-crystal region 324 and trench isolation region 332, and then forms a layer of polysilicon 912 on ONO layer 910.

Next, single-crystal mask 334 is formed on the top surface of polysilicon layer 912. Following this, method 900 is the same as method 600 (except that polysilicon layer 912, ONO layer 910, and single-crystal region 316 are etched instead of just single-crystal region 316), thereby forming EPROM 800.

As noted above, the present invention eliminates edge leakage current due to gate misalignment. In addition to gate misalignment, edge leakage can also occur as a result of radiation. When ionizing radiation from outer space passes through the semiconductor materials that form a transistor, such as silicon and oxide, the radiation causes electron-hole pairs to be formed in the semiconductor materials. The electron-hole pairs formed in silicon typically recombine quickly and, as a result, pose little problem to the operation of the transistor.

However, when the electron-hole pairs are formed in the trench isolation region, the holes can become trapped at trap sites within the oxide. The accumulation of holes at the trap sites produces positive charges at the trap sites which, in turn, attract electrons from the substrate to the trench isolation region.

When the positively-charged trap sites lie at the edge of the trench isolation region adjacent to the channel region, electrons are attracted to the trench isolation region adjacent to the channel region. The accumulation of electrons inverts a portion of the channel region which, in turn, forms a drain-to-source edge leakage current when no gate bias is applied. The drain-to-source edge leakage current consumes power and can be large enough to lead to device failure.

Figure 10A:
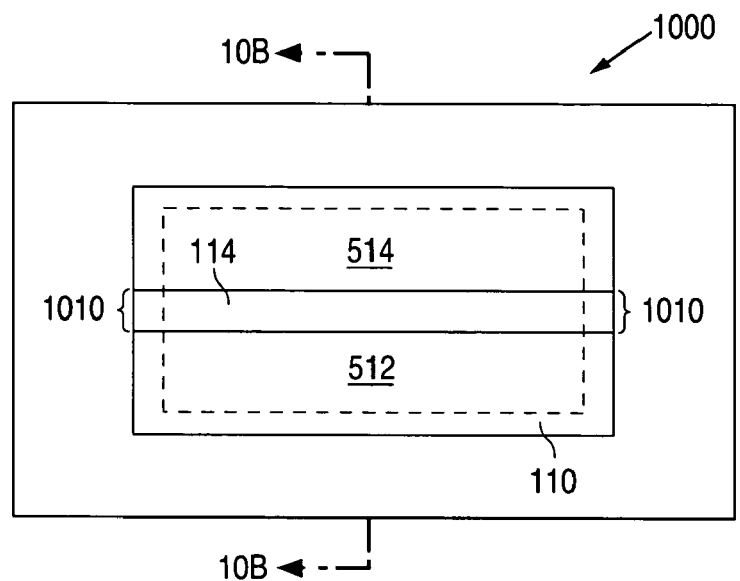
FIGS. 10A–10B are views illustrating an example of a radiation-hardened transistor 1000 in accordance with a fourth embodiment of the present invention.
Figure 10B:
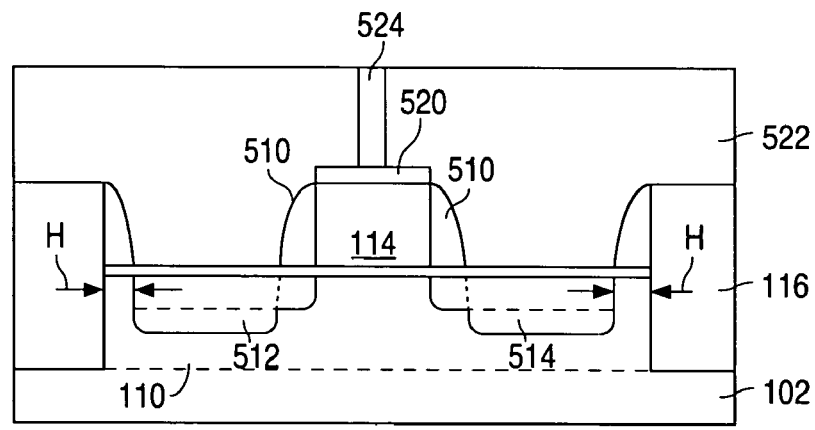

FIGS. 10A–10B show views that illustrate an example of a radiation-hardened transistor 1000 in accordance with a fourth embodiment of the present invention. FIG. 10A shows a plan view of transistor 1000, while FIG. 10B shows a cross-sectional diagram taken along line 10B—10B of FIG. 10A Transistor 1000 is similar to transistor 500 and, as a result, utilizes the same reference numerals as transistor 500.

As shown in FIGS. 10A–10B, radiation-hardened transistor 1000 differs from transistor 500 in that transistor 1000 has source and drain regions 512 and 514 which are spaced a horizontal distance H away from trench isolation region 116, as opposed to contacting trench isolation region 116 as is the case with transistor 500.

By spacing source and drain regions 512 and 514 a horizontal distance H away from trench isolation region 116, the edge leakage currents due to radiation-induced hole trapping, which occurs along edge regions 1010, are eliminated. Thus, transistor 1000 is capable of operating in high radiation environments.

Figure 11A:
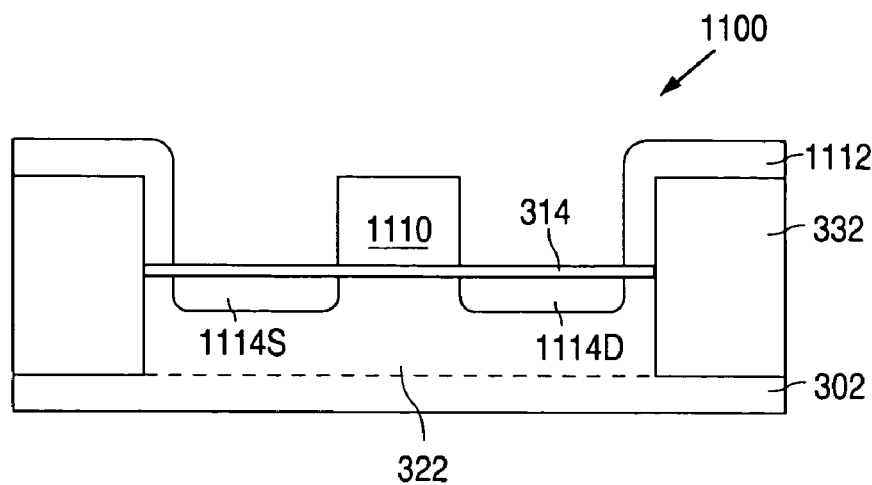
FIGS. 11A–11C are a series of cross-sectional views illustrating an example of a method 1100 of forming a radiation-hardened, single-crystal transistor in accordance with the present invention.
Figure 11B:
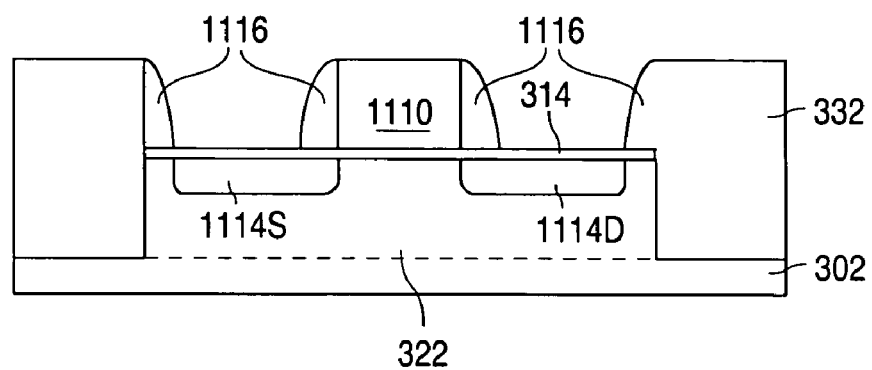
Figure 11C:
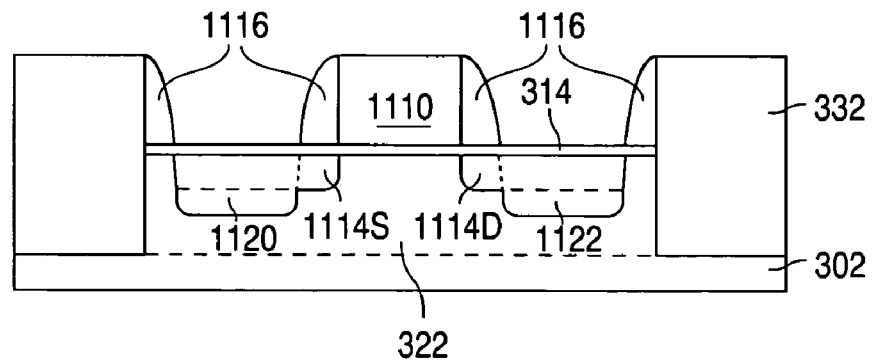

FIGS. 11A–11C show a series of cross-sectional views that illustrate an example of a method 1100 of forming a radiation-hardened, single-crystal transistor in accordance with the present invention. With a few differences, method 1100 includes the steps of method 300 shown in FIGS. 3A–3F, and FIG. 11A illustrates the structure that follows the removal of mask 334. As a result, FIGS. 11A–11D utilize the same reference numerals used in method 300 shown FIGS. 3A–3F.

One difference between method 1100 and method 300, up through the removal of mask 334, is that method 1100 forms insulation layer 314 to have a thickness of, for example, 65 Å rather than the, for example, 500 Å thickness of resistor 200 due to the different functions played by insulation layer 314 in the different devices.

Another difference between the example of method 1100 and the example of method 300 is that method 1100 forms one single-crystal strip rather than the three single-crystal strips 336 shown in FIG. 3F. (Method 1100 can alternately use the structure shown in FIG. 3F to form a single-crystal transistor as a multi-fingered device.) In addition, rather than introducing dopant prior to the formation of mask 334, dopant can be introduced into single-crystal region 324 (single-crystal strip) when the source and drain regions are formed.

As shown in FIG. 11A, method 1100 continues after the removal of mask 334, which forms one single-crystal strip 1110 on insulation layer 314, by forming an implant mask 1112 on trench isolation region 332 and the peripheral region of insulation layer 314. Next, method 1100 implants the exposed regions of insulation layer 314 to form lightly-doped source and drain regions 1114S and 1114D, such as n− regions, in single-crystal region 322. Implant mask 1112 is then removed.

Next, as shown in FIG. 11B, a layer of oxide is formed on insulation layer 314, trench isolation region 332, and strip 1110, and then anisotropically etched back to form side wall spacers 1116 that contact the side walls of trench isolation region 332 and single-crystal strip 1110. Following this, as shown in FIG. 11C, the exposed regions of insulation layer 314 are implanted to form heavily-doped source and drain regions 1120 and 1122, such as n+ regions, in single-crystal region 322, thereby forming transistor 1000.

Figure 12:
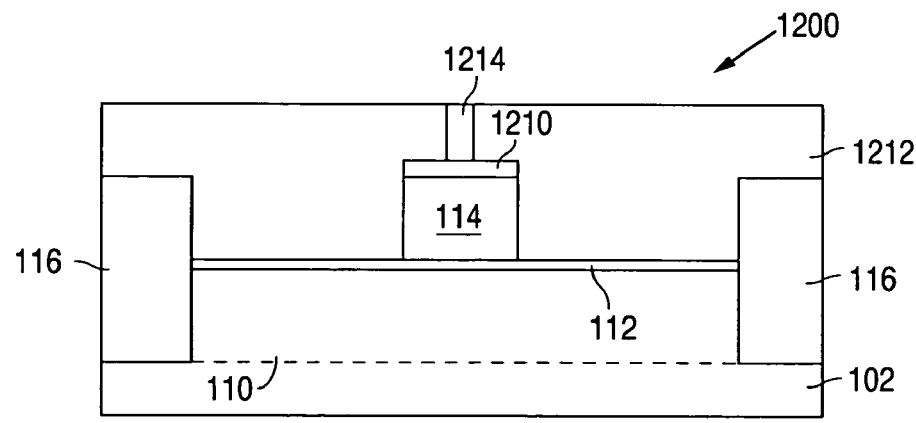
FIG. 12 is a cross-sectional diagram taken along line 1C—1C of FIG. 1A illustrating an example of a capacitor 1200 in accordance with a fifth embodiment of the present invention.

FIG. 12 shows a cross-sectional diagram taken along line 1C—1C of FIG. 1A that illustrates an example of a capacitor 1200 in accordance with a fifth embodiment of the present invention. Capacitor 1200 includes semiconductor structure 100 and, as a result, utilizes the same reference numerals as structure 100.

As shown in FIG. 12, when semiconductor structure 100 implements capacitor 1200, single-crystal region 114 functions as the top plate, while insulation layer 112 functions as the dielectric layer. In addition, single-crystal region 110, which is heavily doped, functions as the bottom plate.

Capacitor 1200 additionally includes a layer of metallic material 1210, such as a silicide, that contacts the top surface of single-crystal region 114, a layer of isolation material 1212 that contacts the top surface of the layer of metallic material 1210, and a metal contact 1214 that is formed through the layer of isolation material 1212 to make an electrical connection with the layer of metallic material 1210.

Capacitor 1200 is formed in the same way that transistor 200 is formed in method 300, except that single-crystal region 322 is doped to have a heavy dopant concentration before mask 334 is formed. In addition, capacitor 1200 can be formed to have top and bottom plates with equal surface areas, as shown in FIG. 3D, by completing the fabrication with the steps required to heavily dope single-crystal regions 322 and 324.

It should be understood that the above descriptions are examples of the present invention, and that various alternatives of the invention described herein may be employed in practicing the invention. Thus, it is intended that the following claims define the scope of the invention and that structures and methods within the scope of these claims and their equivalents be covered thereby.

What is claimed is:

1. A semiconductor structure comprising:
    a first region of single-crystal material having a top surface;
    an insulation layer having a top surface, and a bottom surface that contacts the first region;
    a second region of single-crystal material having a top surface, a bottom surface that contacts the top surface of the insulation layer, and first and second side walls that each extends from the bottom surface of the second region to the top surface of the second region, the second region being spaced apart from the first region and including all contiguous areas of single-crystal material; and
    an isolation structure laterally surrounding the second region, the isolation structure contacting the first side wall of the second region and being spaced apart from a center region of the second side wall of the second region.

2. The semiconductor structure of claim 1 wherein the isolation structure contacts the first region and laterally surrounds a portion of the first region, the portion of the first region having a first conductivity type.

3. The semiconductor structure of claim 2 wherein the portion of the first region contacts no region of a second conductivity type.

4. The semiconductor structure of claim 2 and further comprising:
    spaced-apart source and drain regions of a second conductivity type that contact the portion of the first region; and
    a channel region of the first conductivity type that contacts and lies between the source and drain regions, the channel region lying directly below the second region.

5. The semiconductor structure of claim 4 wherein the drain region has a lightly-doped region and a heavily-doped region that contacts the lightly-doped region.

6. The semiconductor structure of claim 4 and further comprising a non-conducting side wall spacer that contacts the second side wall of the second region and the isolation structure.

7. The semiconductor structure of claim 4 and further comprising:
    a layer of insulating material contacting the top surface of the second region, the layer of insulating material having a top surface; and
    a polysilicon region that contacts the top surface of the layer of insulating material.

8. The semiconductor structure of claim 4 wherein no portion of the isolation structure lies directly over the isolation layer.

9. The semiconductor structure of claim 1 and further comprising a third region of single-crystal material having a top surface, a bottom surface that contacts the top surface of the insulation layer, and first and second side walls that each extends from the bottom surface of the third region to the top surface of the third region, the isolation structure laterally surrounding the third region, the isolation structure contacting the first side wall of the third region and being spaced apart from a center region of the second side wall of the third region.

10. The semiconductor structure of claim 1 wherein the first side wall of the second region contacts only the isolation structure, and the first region has a first conductivity type.

11. The semiconductor structure of claim 10 and further comprising:
    spaced-apart source and drain regions of a second conductivity type that contact the first region; and
    a channel region of the first conductivity type that contacts and lies between the source and drain regions, the channel region lying directly below the second region.

12. The semiconductor structure of claim 11 wherein the drain region has a lightly-doped region and a heavily-doped region that contacts the lightly-doped region.

13. The semiconductor structure of claim 11 and further comprising a non-conducting side wall spacer that contacts the second side wall of the second region and the isolation structure.

14. The semiconductor structure of claim 11 and further comprising:
    a layer of insulating material contacting the top surface of the second region, the layer of insulating material having a top surface; and
    a polysilicon region that contacts the top surface of the layer of insulating material.

15. The semiconductor structure of claim 1 wherein the first region has a first conductivity type.

16. The semiconductor structure of claim 15 and further comprising:
    spaced-apart source and drain regions of a second conductivity type that contact the first region; and
    a channel region of the first conductivity type that contacts and lies between the source and drain regions, the channel region lying directly below the second region.

17. The semiconductor structure of claim 16 wherein the drain region has a lightly-doped region and a heavily-doped region that contacts the lightly-doped region.

18. The semiconductor structure of claim 16 and further comprising a non-conducting side wall spacer that contacts the second side wall of the second region and the isolation structure.

19. The semiconductor structure of claim 16 and further comprising:
    a layer of insulating material contacting the top surface of the second region, the layer of insulating material having a top surface; and
    a polysilicon region that contacts the top surface of the layer of insulating material.

20. The semiconductor structure of claim 1 wherein the second region has a length defined by the isolation region.

21. The semiconductor structure of claim 1 wherein no portion of the isolation structure lies directly over the isolation layer.

22. A semiconductor structure comprising:
    a first region of single-crystal material having a top surface;
    an insulation layer having a top surface, and a bottom surface that contacts the first region;
    a second region of single-crystal material having a top surface, a bottom surface that contacts the top surface of the insulation layer, and first and second side walls that each extends from the bottom surface of the second region to the top surface of the second region, the second region being spaced apart from the first region and including all contiguous areas of single-crystal material; and a trench of isolation material laterally surrounding the second region, the trench of isolation material contacting the first side wall of the second region and being spaced apart from a center region of the second side wall of the second region.

23. The semiconductor structure of claim 22 wherein the top surface of the first region and the top surface of the second region lie substantially in a common plane.

24. The semiconductor structure of claim 22 wherein a top surface of the trench, the top surface of the first region, and the top surface of the second region lie substantially in a common plane.

25. The semiconductor structure of claim 22 and further comprising:

spaced-apart source and drain regions of a second conductivity type that contact the first region; and a channel region of the first conductivity type that contacts and lies between the source and drain regions, the channel region lying directly below the second region.

26. A semiconductor structure comprising:

a first region of single-crystal material having a top surface;

an insulation layer having a top surface, and a bottom surface that contacts the first region;

a second region of single-crystal material having a top surface, a bottom surface that contacts the top surface of the insulation layer, and first and second side walls that each extends from the bottom surface of the second region to the top surface of the second region, the second region being spaced apart from the first region and including all contiguous areas of single-crystal material, the top surface of the first region and the top surface of the second region lying substantially in a common plane;

spaced-apart source and drain regions of a second conductivity type that contact the first region; and a channel region of the first conductivity type that contacts and lies between the source and drain regions, the channel region lying directly below the second region.

27. The semiconductor structure of claim 26 wherein the source and drain regions lie completely below the bottom surface of the insulation layer.

* * * * *